(12) United States Patent
Lee et al.

(10) Patent No.: US 10,756,551 B2
(45) Date of Patent: Aug. 25, 2020

(54) CHARGING SYSTEM WITH SENSOR DIAGNOSIS FUNCTION AND METHOD OF DIAGNOSING SENSOR APPLIED TO THE SAME

(71) Applicants: Hyundai Motor Company, Seoul (KR); Kia Motors Corporation, Seoul (KR)

(72) Inventors: Ho Joong Lee, Gyeonggi-do (KR); Han Shin Youn, Seoul (KR); Jee Heon Kim, Gyeonggi-do (KR); Dong Jun Lee, Gyeonggi-do (KR); Hye Seung Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 144 days.

(21) Appl. No.: 15/995,765

(22) Filed: Jun. 1, 2018

(65) Prior Publication Data
US 2019/0190285 A1 Jun. 20, 2019

(30) Foreign Application Priority Data
Dec. 18, 2017 (KR) .......................... 10-2017-0173806

(51) Int. Cl.
| | | |
|---|---|---|
| *H02J 7/00* | (2006.01) | |
| *H02J 7/14* | (2006.01) | |
| *B60W 10/24* | (2006.01) | |
| *G01R 31/382* | (2019.01) | |
| *G01R 31/385* | (2019.01) | |
| *B60L 50/50* | (2019.01) | |

(52) U.S. Cl.
CPC ............ *H02J 7/0029* (2013.01); *B60L 50/50* (2019.02); *B60W 10/24* (2013.01); *G01R 31/382* (2019.01); *G01R 31/385* (2019.01); *H02J 7/00304* (2020.01)

(58) Field of Classification Search
USPC .................................................. 320/149, 150
See application file for complete search history.

(56) References Cited

U.S. PATENT DOCUMENTS

| 7,012,413 B1* | 3/2006 | Ye ........................... H02M 1/42 323/222 |
|---|---|---|
| 2013/0069425 A1* | 3/2013 | Kanazawa ............ H01M 10/44 307/9.1 |

(Continued)

FOREIGN PATENT DOCUMENTS

| KR | 10-2014-0114175 | 9/2014 |
|---|---|---|
| KR | 10-2016-0013551 | 2/2016 |

*Primary Examiner* — Alexis B Pacheco
(74) *Attorney, Agent, or Firm* — Mintz Levin Cohn Ferris Glovsky and Popeo, P.C.; Peter F. Corless

(57) ABSTRACT

A charging system with a sensor diagnosis function is provided. The system includes an AC input voltage sensor that detects a voltage of an input end with an AC power applied thereto and a resistor that is connected to the input end. A power factor correction circuit unit adjusts and outputs a power factor of AC power applied through the resistor. An output voltage of the power factor correction circuit unit is applied to a capacity of the system. A controller then diagnoses the AC input voltage sensor based on a value of current passing through the resistor, a value of a voltage of the capacitor, and a resistance value of the resistor.

10 Claims, 5 Drawing Sheets

(56) References Cited

U.S. PATENT DOCUMENTS

| | | | | |
|---|---|---|---|---|
| 2014/0015496 A1* | 1/2014 | Nishiguchi | ............ | H02J 7/007 |
| | | | | 320/162 |
| 2014/0077770 A1* | 3/2014 | Omoto | ................ | H02M 1/4225 |
| | | | | 320/140 |
| 2015/0155602 A1* | 6/2015 | Hwang | ............... | H01M 10/425 |
| | | | | 429/50 |
| 2015/0298568 A1* | 10/2015 | Mitsutani | .............. | H02J 7/0054 |
| | | | | 307/9.1 |
| 2017/0087998 A1* | 3/2017 | Minamii | ............ | B60L 11/1811 |
| 2018/0026468 A1* | 1/2018 | Lee | ....................... | H02J 7/0052 |
| | | | | 320/107 |
| 2018/0175652 A1* | 6/2018 | Jang | ..................... | H02M 7/217 |

\* cited by examiner

CHARGING SYSTEM WITH SENSOR DIAGNOSIS FUNCTION AND METHOD OF DIAGNOSING SENSOR APPLIED TO THE SAME

CROSS-REFERENCE TO RELATED APPLICATION

This application claims the priority benefit of Korean Patent Application No. 10-2017-0173806, filed on Dec. 18, 2017, the disclosure of which is incorporated herein by reference.

BACKGROUND

1. Field of the Invention

The present invention relates to a charging system and a method of diagnosing a sensor applied to the charging system, and more particularly, a charging system with a sensor diagnosis function and a method of diagnosing a sensor applied to the charging system for more accurately diagnosing a state of an alternating current (AC) input voltage sensor that detects a value of an external AC input voltage to prevent a situation in which charging is not possible or to prevent charging from being delayed and to satisfy various vehicle related standards.

2. Description of the Related Art

As issues such as global warming and environmental pollution have significantly emerged, research has been conducted into an eco-friendly vehicle that is capable of reducing environmental pollution in the automobile industry and the eco-friendly vehicle market has been gradually enlarged. An electric vehicle, a hybrid vehicle, and a plug-in hybrid vehicle, which employ an electric motor for generating driving force using electric energy instead of an engine for generating driving force by burning typical fossil fuel, have globally come to the market as eco-friendly vehicles. Among such eco-friendly vehicles using electric energy, an electric vehicle and a plug-in hybrid vehicle receive power from external charging equipment connected to a grid to recharge a battery installed in a vehicle and produce kinetic energy required to drive a vehicle using the power recharged in the battery. Accordingly, an eco-friendly vehicle includes an on-board charger (OBC) that receives grid power from external charging equipment and converts the grid power into power for charging a battery.

An on-board charger (OBC) includes a plurality of sensors installed therein to detect information for control of the charging. In particular, when an alternating current (AC) input voltage sensor installed at an input end of an on-board charger that receives grid power from external charging equipment malfunctions, charging may not be possible or charging time may be delayed compared with desired time due to abnormal output limiting. According to the California air resources board (CARB) regulations of North America, a state diagnosis function needs to be added to a sensor through which a vehicle controller receives information and, accordingly, there is a need for a diagnosis function with respect to an AC input voltage sensor installed at an input end of an on-board charger.

The matters disclosed in this section is merely for enhancement of understanding of the general background of the invention and should not be taken as an acknowledgment or any form of suggestion that the matters form the related art already known to a person skilled in the art.

SUMMARY

Therefore, the present invention provides a charging system with a sensor diagnosis function and a method of diagnosing a sensor applied to the charging system for more accurately diagnosing a state of an alternating current (AC) input voltage sensor provided to detect a value of an external AC input voltage to prevent a situation in which charging is not possible or to prevent charging from being delayed and to satisfy various vehicle related standards.

In accordance with an aspect of the present invention, a charging system with a sensor diagnosis function, is provided and may include an alternating current (AC) input voltage sensor configured to detect a voltage of an input end with AC power applied thereto, a resistor connected to the input end, a power factor correction circuit unit configured to adjust and output a power factor of AC power applied through the resistor, a capacitor to which an output voltage of the power factor correction circuit unit is applied, and a controller configured to diagnose the AC input voltage sensor based on a value of current passing through the resistor, a value of the voltage of the capacitor, and a resistance value of the resistor.

The charging system may further include a relay connected in parallel to the resistor, wherein the controller may be configured to convert the relay to a short-circuit state from an open state when the voltage of the capacitor is equal to or greater than a predetermined reference value after an operation of the charging system is started. The controller may then be configured to diagnose the AC input voltage sensor when the relay is in an open state.

The resistor may have a varied resistance value based on temperature, and the controller may be configured to estimate temperature of the resistor, estimate the resistance value of the resistor based on the estimated temperature of the resistor, and diagnose the AC input voltage sensor using the estimated resistance value of the resistor. The controller may be configured to estimate a value of an AC input voltage using a value of current passing through the resistor, the estimated resistance value of the resistor, and a value of the voltage of the capacitor.

Further, the controller may be configured to compare the estimated value of the AC input voltage and a detected value detected by the AC input voltage sensor to diagnose a state of the AC input voltage sensor. The controller may be configured to repeatedly determine a state of the AC input voltage sensor at a predetermined period and, during one determination period, the controller may be configured to calculate a heated amount due to the resistor using current passing through the resistor and the estimated resistance value of the resistor estimated during a previous period, subtract a predetermined heat dissipation amount from the calculated heated amount to derive temperature variation amount, and add the temperature variation amount to the estimated temperature of the resistor determined during the previous period to determine the estimated temperature of the resistor.

In accordance with another aspect of the present invention, a method of diagnosing a sensor applied to the charging system may include receiving a detected value of current passing through the resistor and a detected value of a voltage of the capacitor when an alternating current (AC) input voltage is applied to the input end, estimating a resistance value of the resistor based on the temperature, estimating a value of the AC input voltage using the estimated resistance value of the resistor, the detected value of the current, and the detected value of the voltage, comparing a detected value of an AC input voltage detected by the AC input voltage sensor and the estimated value of the AC input voltage estimated in the estimating of the voltage, and diagnosing a state of the AC input voltage sensor based on a difference between the detected value of the AC input voltage and the estimated value of the AC input voltage.

The method may be repeatedly performed at a predetermined period, and the estimating of the resistance value may include determining the resistance value of the resistor based on an outdoor temperature during a first period. Additionally, the estimating of the resistance value may include calculating a heated amount due to the resistor using current passing through the resistor and the estimated resistance value of the resistor estimated during a previous period, subtracting a predetermined heat dissipation amount from the calculated heated amount to derive temperature variation amount, adding the temperature variation amount to the estimated temperature of the resistor determined during the previous period to determine the estimated temperature of the resistor, and determining the resistance value of the resistor based on the estimated temperature of the resistor. The receiving of the detected value may include opening a relay connected in parallel to opposite ends of the resistor to transmit AC power input through the input end through the resistor.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, a charging system with a sensor diagnosis function and a method of diagnosing a sensor applied to the charging system according to exemplary embodiments of the present invention will be described with reference to the accompanying drawings.

Figure 1:
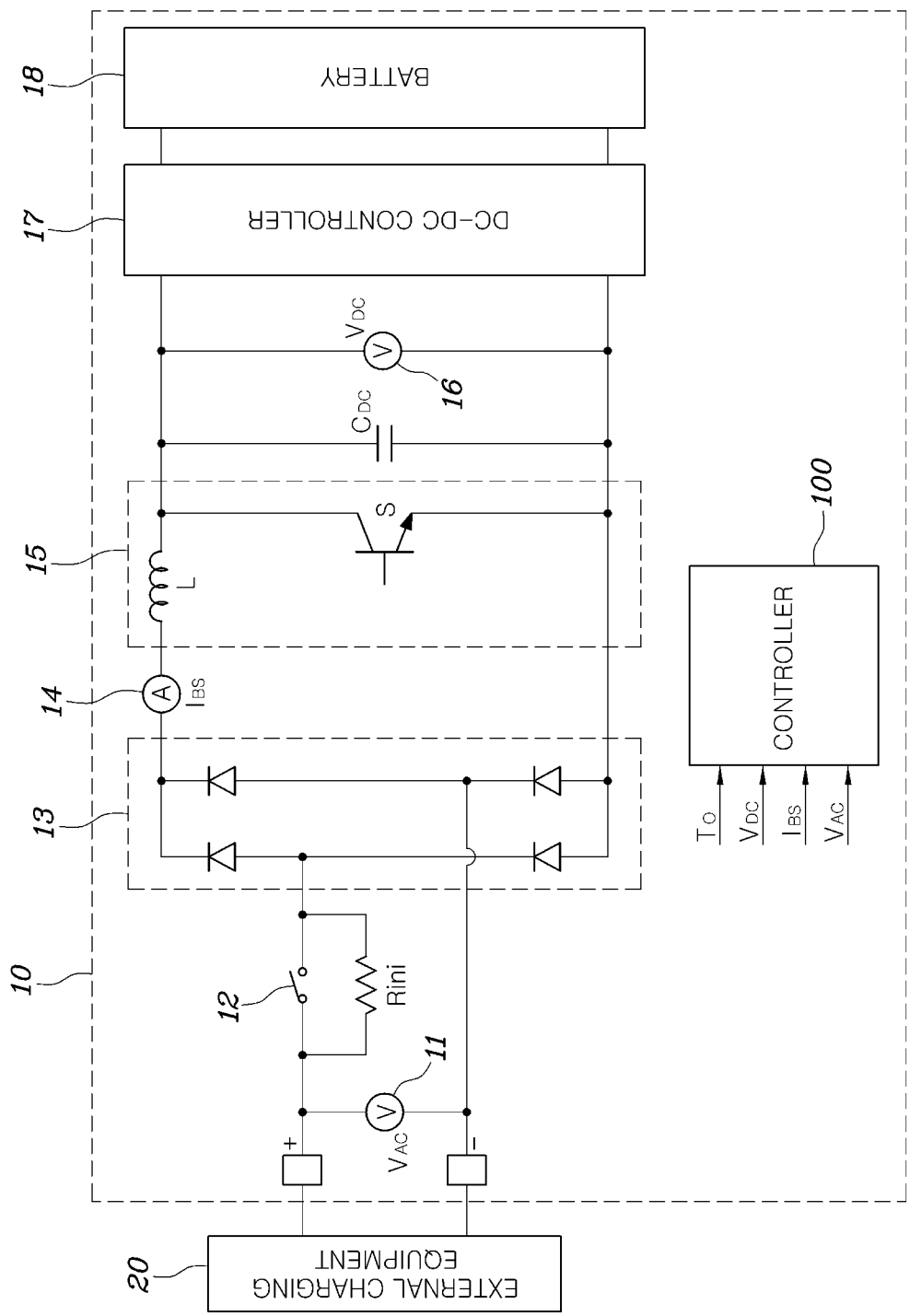
FIG. 1 is a block diagram showing a configuration of a charging system with a sensor diagnosis function according to an exemplary embodiment of the present invention.

FIG. 1 is a block diagram showing a configuration of a charging system with a sensor diagnosis function according to an exemplary embodiment of the present invention. Referring to FIG. 1, the charging system with a sensor diagnosis function according to an exemplary embodiment of the present invention may be a charging system configured to diagnose an alternating current (AC) input voltage sensor 11 of an input end of an on-board charger (OBC) installed in a vehicle 10, i.e., an input end to which grid power of alternating current (AC) from external charging equipment 20.

In particular, the charging system with a sensor diagnosis function according to an exemplary embodiment of the present invention may include the AC input voltage sensor 11 configured to detect a voltage of an input end to which AC power is input, a resistor $R_{ini}$ connected to the input end, a power factor correction circuit unit 15 configured to adjust and output AC power applied through the resistor $R_{ini}$, a capacitor $C_{DC}$ to which an output voltage of the power factor correction circuit unit 15, and a controller 100 configured to diagnose the AC input voltage sensor 11 based on a value of current $I_{BS}$ passing through the resistor $R_{ini}$, a value of a voltage $V_{DC}$ of the capacitor $C_{DC}$, and a resistance value of the resistor $R_{ini}$.

The AC input voltage sensor 11 may be configured to detect an AC input voltage $V_{AC}$ applied to a charger input end of a vehicle from the external charging equipment 20 and may be a diagnosis target in the charging system with a sensor diagnosis function according to an exemplary embodiment of the present invention. The charging system with a sensor diagnosis function according to an exemplary embodiment of the present invention may be configured to compare an estimated value of an AC input voltage calculated using current/voltage detected in a charger and values of the resistor $R_{ini}$ and a detected value of an AC input voltage detected by the AC input voltage sensor 11 to diagnose a state of the AC input voltage sensor 11.

The resistor $R_{ini}$ may be connected to an input end of a charger and applied to interrupt sudden introduction of current (over current) when charging is started. The resistor $R_{ini}$ may be used in an initial stage of charging and, thus, may also be referred to as 'initial charging resistance' or 'initial-charging resistance'. A relay 12 may be connected in parallel to the resistor $R_{ini}$. Further, the controller 100 configured to operate a charger may be configured to switch the relay 12 to a short-circuit state from an open state when a voltage of the capacitor $C_{DC}$ is equal to or less than a predetermined reference value after an operation of a charger is started. In other words, the relay 12 may be open and power input to an input end may be transmitted to the resistor $R_{ini}$ at an initial stage of charging and, after the capacitor $C_{DC}$ may be recharged to a predetermined level or greater, the relay 12 may be short-circuited and power may be transmitted through the relay 12 rather than being transmitted through the resistor $R_{ini}$ any longer.

In consideration of such as connection relationship between the resistor $R_{ini}$ and the relay 12, sensor diagnosis schemes according to various exemplary embodiments of the present invention may be implemented before the relay 12 enters a short-circuit state, that is, at an initial stage of charging in which power is transmitted through the resistor $R_{ini}$.

Additionally, the power factor correction circuit unit 15 may be configured to adjust and output a power factor of AC power provided from an external power supply device. For example, the power factor correction circuit unit 15 may apply a topology of a boost converter including an inductor, a switching device, or the like. In other words, as shown in FIG. 1, an input end of the power factor correction circuit unit 15 may be connected to the resistor $R_{ini}$ to receive power transmitted through the resistor $R_{ini}$ and may include an inductor L having a first end connected to the resistor $R_{ini}$ and a second end connected to a second end of the capacitor $C_{DC}$ and a switching device S that either forms or blocks electric connection between the second end of the inductor L and the second end of the capacitor $C_{DC}$. In this circuit structure, the power factor correction circuit unit 15 may be operated as a boost converter by pulse width modulation (PWM)-controlling the switching device S after an operation of initially recharging the capacitor $C_{DC}$ is performed.

A rectification circuit unit 13 for rectifying AC power may be included between the resistor $R_{ini}$ and the power factor correction circuit unit 15. The rectification circuit unit 13 may be embodied as a diode rectification circuit unit 13 configured with a full-bridge circuit including four diodes. The input end of the power factor correction circuit unit 15 may include a current sensor 14 configured to detect current $I_{BS}$ passing through the resistor $R_{ini}$, i.e., current $I_{BS}$ input to the power factor correction circuit unit 15.

The capacitor $C_{DC}$ may be recharged with power output from the power factor correction circuit unit 15. The voltage $V_{DC}$ formed between opposite ends of a capacitor via charging of the capacitor $C_{DC}$ may be detected by a direct current (DC) voltage sensor 16. A voltage of the capacitor $C_{DC}$ may be applied to a battery 18 after a voltage level is converted by a DC-DC converter 17 and, then, the battery 18 may be recharged. The DC-DC converter 17 may be embodied with various topologies known to one ordinary skill in the art, such as an insulating type DC-DC converter circuit with input and output terminals that are electrically insulated from each other or a non-insulating type DC-DC converter. The controller 100 may be configured to diagnose a state of the AC input voltage sensor 11 based on the current $I_{BS}$ passing through the resistor $R_{ini}$, the voltage $V_{DC}$ of the capacitor $C_{DC}$, and a resistance value of the resistor $R_{ini}$.

Figure 2:
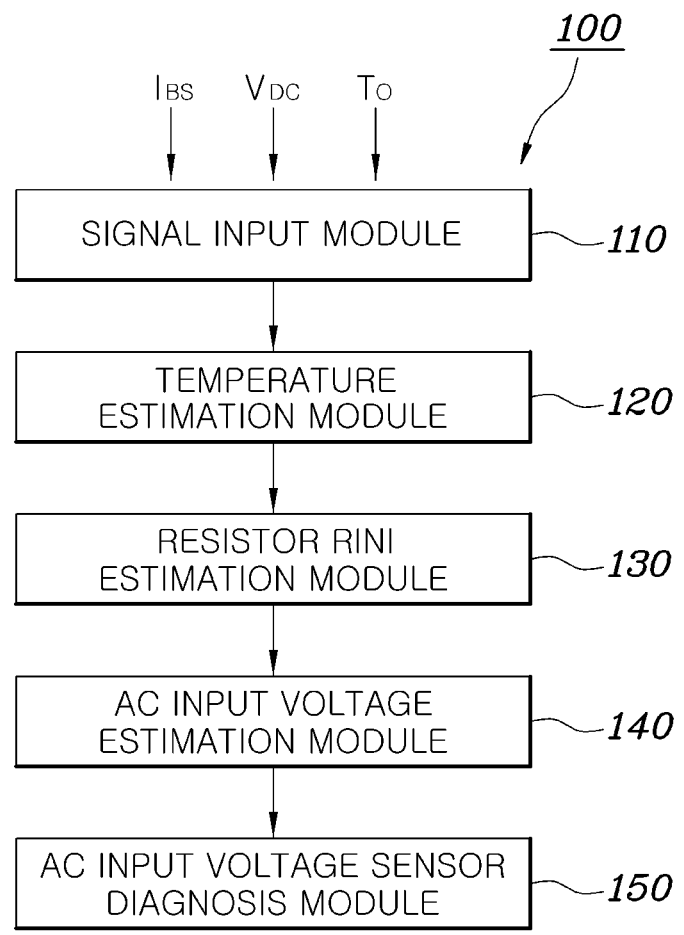
FIG. 2 is a more detailed block diagram showing a configuration of a controller of a charging system with a sensor diagnosis function according to an exemplary embodiment of the present invention.

FIG. 2 is a more detailed block diagram showing a configuration of a controller of a charging system with a sensor diagnosis function according to an exemplary embodiment of the present invention. Referring to FIG. 2, the controller 100 of the charging system with a sensor diagnosis function according to an exemplary embodiment of the present invention may include a signal input module 110 configured to receive current $I_{BS}$ passing through the resistor $R_{ini}$, the voltage $V_{DC}$ of the capacitor $C_{DC}$, and outdoor temperature $T_o$, as factors required to diagnose the AC input voltage sensor 11, temperature estimation module 120 configured to estimate temperature (e.g., resistor surrounding temperature) of the resistor $R_{ini}$ via calculation, a resistance estimation module 130 configured to estimate a resistance value of the resistor $R_{ini}$ using the outdoor temperature $T_o$ or temperature of the resistor $R_{ini}$ calculated by the temperature estimation module 120, an AC input voltage estimation module 140 configured to estimate a value of an AC input voltage using a resistance estimated value calculated by the resistance estimation module 130, and values of the current $I_{BS}$ and the voltage $V_{DC}$, and an AC input voltage sensor diagnosis module 150 configured to compare the voltage detected value detected by the AC input voltage sensor 11 and the estimated value of the AC input voltage calculated by the AC input voltage estimation module to diagnose a state of the AC input voltage sensor 11.

A method of diagnosing a sensor applied to the above-configured charging system with a sensor diagnosis function according to various exemplary embodiments of the present invention will be described below in detail. An operating effect of the charging system will be sufficiently understood through a description of the method of diagnosing the sensor applied to the charging system.

Figure 3:
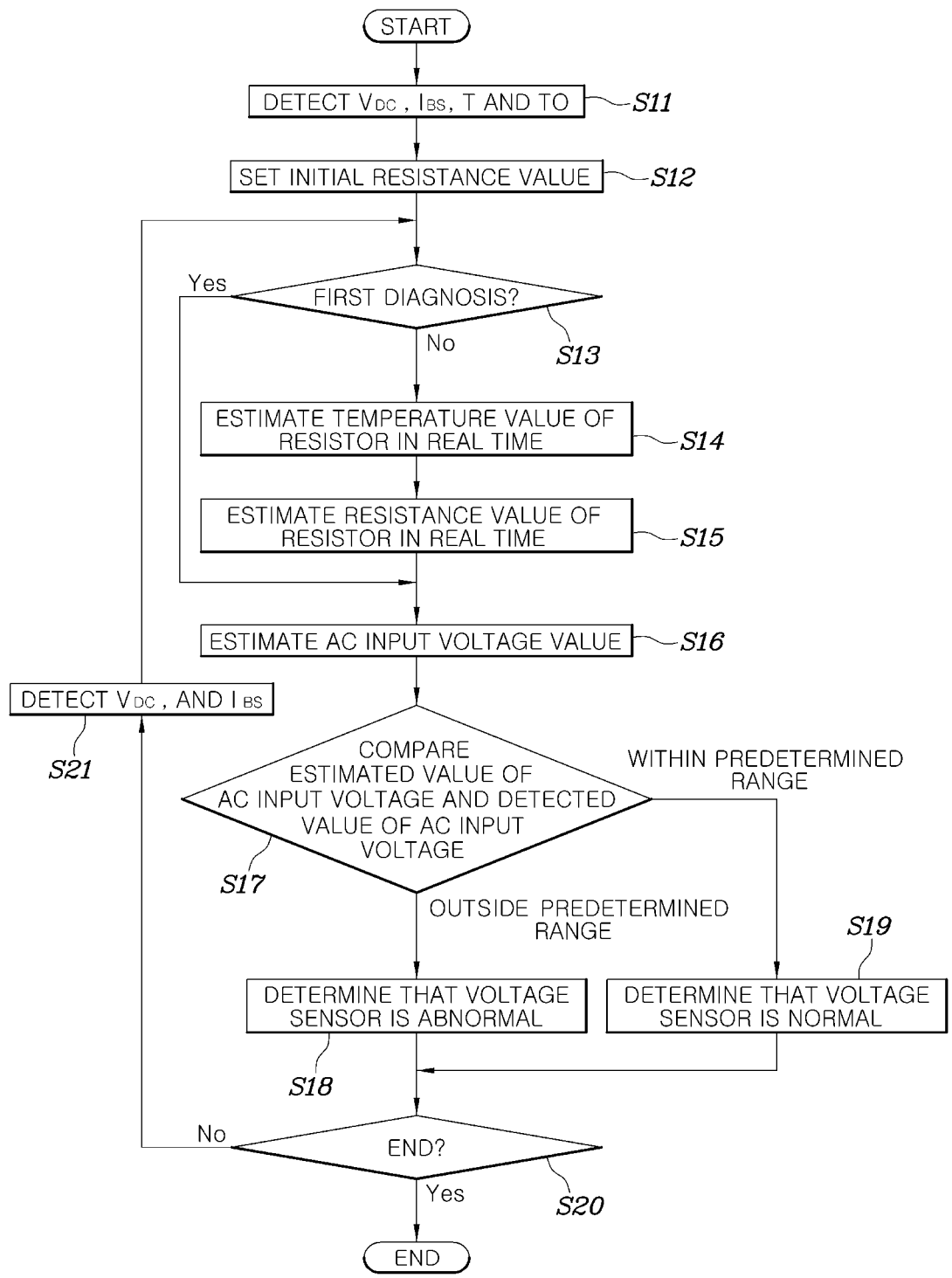
FIG. 3 is a flowchart showing a method of diagnosing a sensor applied to a charging system according to an exemplary embodiment of the present invention.

FIG. 3 is a flowchart showing a method of diagnosing a sensor applied to a charging system according to an exemplary embodiment of the present invention. The method described herein below may be executed by a controller. When electric connection between the external charging equipment 20 and a charger installed in the vehicle 10 is formed and AC power is applied from the external charging equipment 20 to begin to recharge a vehicle, the controller 100 may be configured to open the relay 12 to input AC power to a charger through the resistor $R_{ini}$ and receive a value detected by each of the sensors 11, 14, and 16 and information regarding temperature of the resistor $R_{ini}$ through the signal input module 110 (S11).

Further, the resistance estimation module 130 of the controller 100 may be configured to set an initial resistance value of the resistor $R_{ini}$. Since the resistor $R_{ini}$ may be used specifically at an initial stage of charging, temperature of the resistor $R_{ini}$ may be considered to be substantially the same as outdoor temperature immediately after charging is started. Accordingly, the controller 100 may be configured to determine an initial resistance value based on temperature detected value detected by an outdoor temperature sensor installed in the vehicle (S12).

Figure 4:
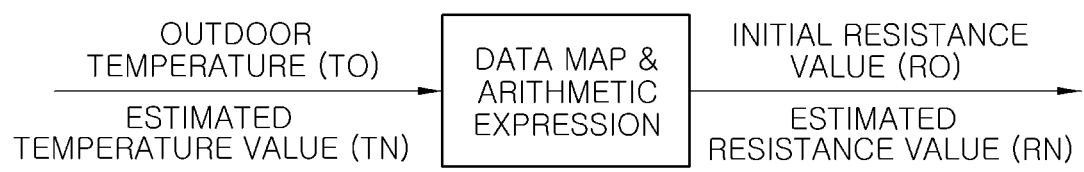
FIG. 4 is a diagram showing a method of determining a resistance value of a resistor in a method of diagnosing a sensor applied to a charging system according to an exemplary embodiment of the present invention.

FIG. 4 is a diagram showing an example of a method of determining a resistance value of a resistor in a method of diagnosing a sensor applied to a charging system according to an exemplary embodiment of the present invention.

As shown in FIG. 4, in the method of diagnosing a sensor applied to a charging system according to an exemplary embodiment of the present invention, a data map or arithmetic expression of the resistance estimation module 130 may be stored and a corresponding resistance value may be retrieved from the data map using the outdoor temperature $T_o$ as an input value or may be derived by inputting the outdoor temperature $T_o$ into the arithmetic expression at an initial state of charging. In general, resistors have characteristics whereby a resistance value thereof is varied based on temperature. Accordingly, a manufacturer of resistors provides the characteristics whereby a resistance value thereof is varied based on temperature. Even if the characteristics whereby a resistance value thereof is varied based on temperature are not provided from the manufacturer of resistors, the characteristics whereby a resistance value thereof is varied based on temperature may be recognized via an experimental method and the data map or the arithmetic expression may be predetermined.

In operation S12, an outdoor temperature may be input to the data map or the arithmetic expression to determine an initial resistance value of a resistor. When currently performed procedures are used to initially diagnose the AC input voltage sensor, the AC input voltage estimation module 140 of the controller 100 may be configured to estimate a value of the AC input voltage using the initial resistance value of the resistor $R_{ini}$ determined in operation S12, a value of the detected voltage $V_{DC}$ of the capacitor, and a value of current $I_{BS}$ passing through the resistor $R_{ini}$ (S16). In the circuit structure shown in FIG. 1, an estimated value $V_{AC\_EST}$ of the AC input voltage may be determined according to Equation 1 below.

$$V_{AC\_EST}=(Rn \times I_{BS})+V_{DC} \qquad (1)$$

In Equation 1 above, Rn may be an estimated resistance value of the resistor $R_{ini}$ determined by the resistance estimation module 130 based on temperature and may be an initial resistance value determined based on the outdoor temperature $T_o$ at initial diagnosis. In addition, in Equation 1 above, the estimated value $V_{AC\_EST}$ of the AC input voltage does not completely correspond to the AC input voltage derived via circuit analysis (e.g., a value corresponding to voltage drop via a diode of the rectification circuit unit 13 is not applied), which may be overcome by setting a reference range for determining whether a sensor is abnormal (e.g., malfunction or failure of sensor) in a procedure of comparing the estimated value $V_{AC\_EST}$ of the AC input voltage and the detected value of the AC input voltage detected by the sensor 11 to diagnose the sensor 11 based on a difference between the estimated value $V_{AC\_EST}$ and the detected value of the AC input voltage.

Further, the AC input voltage sensor diagnosis module 150 of the controller 100 may be configured to compare the detected value of the AC input voltage detected by the AC input voltage sensor 11 and the estimated value of the AC input voltage derived by the AC input voltage estimation module 140 (S17). The AC input voltage sensor diagnosis module 150 of the controller 100 may then be configured to determine that the AC input voltage sensor 11 is abnormal or malfunctions when the difference between the detected value of the AC input voltage detected by the AC input voltage sensor 11 and the estimated value of the AC input voltage derived by the AC input voltage estimation module 140 is beyond a predetermined range (S18) and may be configured to determine that the AC input voltage sensor 11 is normal (e.g., without failure or malfunction) when the difference between the two values is within the predetermined range (S19).

When short circuits of the relay 12 are not performed, the controller 100 may be configured to re-perform a diagnosis procedure rather than terminating diagnosis (S20). In other words, the controller 100 may be configured to repeatedly perform a series of procedures of diagnosing the AC input voltage sensor 11 every predetermined period (e.g., predetermined period of time) when power is transmitted through the resistor $R_{ini}$. Needless to say, when a new period is started, AC detected value $I_{BS}$ and DC voltage detected value $V_{DC}$ may be re-detected through the sensors 14 and 16 (S21).

When previous diagnosis instead of first diagnosis is performed at a predetermined period (S13), the controller 100 may perform operation S14 of estimating temperature value of the resistor $R_{ini}$ in real time. In other words, in consideration of the fact that temperature of resistor $R_{ini}$ is changed as initial charging is performed, a procedure of estimating the temperature of the resistor $R_{ini}$ may be re-performed (S14).

The temperature estimation module 120 of the controller 100 may be configured to derive a temperature variation amount using the AC detected value $I_{BS}$ detected during a current period, an estimated resistance value of the resistor $R_{ini}$ detected during a previous period, and a predetermined discharge amount and may add the temperature variation amount to the temperature estimated value derived during the previous period to calculate a real-time temperature estimated value Tn during the current period.

Figure 5:
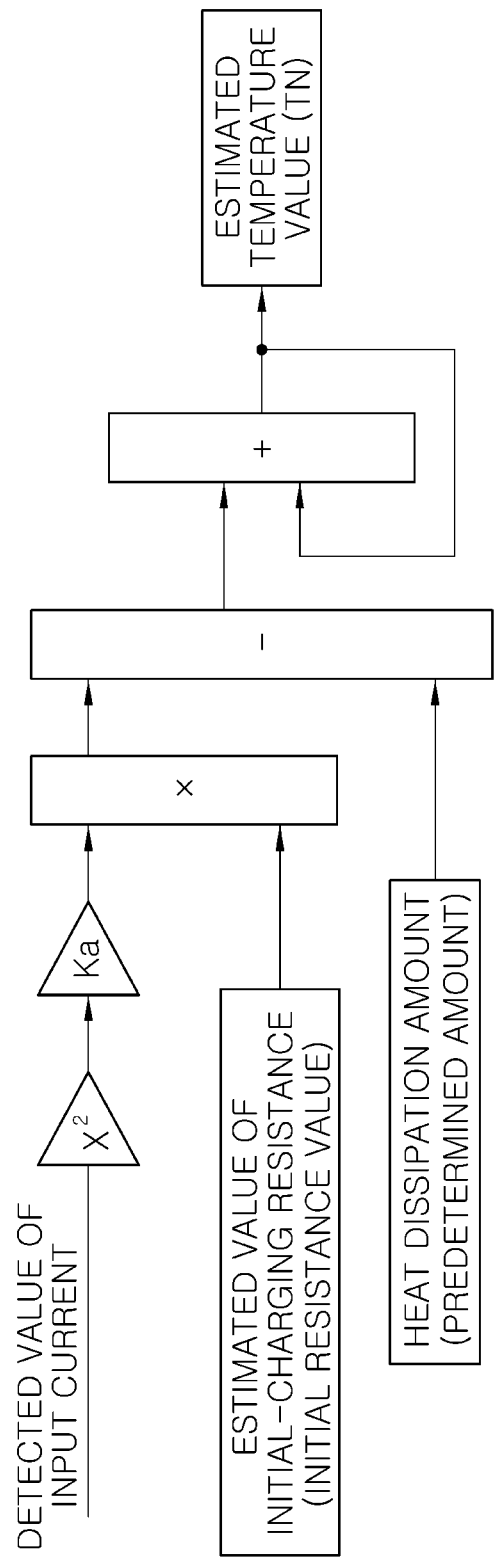
FIG. 5 is a diagram showing a temperature estimation method of a resistor applied to a charging system according to an exemplary embodiment of the present invention.

FIG. 5 is a diagram showing a temperature estimation method of a resistor applied to a charging system according to an exemplary embodiment of the present invention. As shown in FIG. 5, the AC detected value $I_{BS}$ may be squared and the estimated value of the resistor $R_{ini}$ derived during a previous period or an initial resistance value may be multiplied by the resultant value to derive power and a heat dissipation amount of a region in which the resistor $R_{ini}$ is installed may be subtracted from the power to derive temperature variation amount. In FIG. 5, Ka may be a constant for compensating for a difference between a theoretical calculation method and a calculation method using an actually detected value and may be experimentally determined. In addition, conversion required to acquire a desired physical amount via each calculation is not shown in FIG. 5 and will be to aid in conceptual understanding.

The real-time resistor temperature estimated value Tn derived in operation S14 may be transmitted to the temperature estimation module 120 and the temperature estimation module 120 may be configured to apply the resistor temperature estimated value Tn to the data map or the arithmetic expression to derive an estimated value of the resistor $R_{ini}$. As described above, the estimated value of the AC input voltage may be generated using Equation 1 above (S16), the value detected by the sensor 11 and the estimated value estimated in operation S16 may be compared (S17) to diagnose a state of the AC input voltage sensor 11.

As described above, the charging system with a sensor diagnosis function and the method of diagnosing a sensor applied to the charging system according to various exemplary embodiments of the present invention may diagnose a sensor in a simplified manner via a software scheme without additional costs such as an additional sensor to satisfy standards or specifications required for sensor diagnosis. In addition, real-time change in temperature may be applied to more accurately diagnose a sensor and, accordingly, when a vehicle battery charging time is delayed or charging is not possible, reasons therefor may be rapidly diagnosed to enhance the marketability of a vehicle.

Although the exemplary embodiments of the present invention have been described above with reference to the accompanying drawings, those skilled in the art will appreciate that the present invention can be implemented in various other exemplary embodiments without changing the technical ideas or features thereof.

What is claimed is:

1. A charging system with a sensor diagnosis function, comprising:
    an alternating current (AC) input voltage sensor configured to detect a voltage of an input end with AC power applied thereto;
    a resistor connected to the input end;
    a power factor correction circuit unit configured to adjust and output a power factor of AC power applied through the resistor;
    a capacitor to which an output voltage of the power factor correction circuit unit is applied; and
    a controller configured to diagnose the AC input voltage sensor based on a value of current passing through the resistor, a value of the voltage of the capacitor, and a resistance value of the resistor,
    wherein the resistor has a varied resistance value based on temperature, and wherein the controller is configured to estimate temperature of the resistor, estimate the resistance value of the resistor based on the estimated temperature of the resistor, and diagnose the AC input voltage sensor using the estimated resistance value of the resistor.

2. The charging system according to claim 1, further comprising:
    a relay connected in parallel to the resistor,
    wherein the controller is configured to convert the relay to a short-circuit state from an open state when the voltage of the capacitor is equal to or greater than a predetermined reference value after an operation of the charging system is started.

3. The charging system according to claim 2, wherein the controller is configured to diagnose the AC input voltage sensor when the relay is in an open state.

4. The charging system according to claim 1, wherein the controller is configured to estimate a value of an AC input voltage using the value of current passing through the resistor, the estimated resistance value of the resistor, and the value of the voltage of the capacitor.

5. The charging system according to claim 4, wherein the controller is configured to compare the estimated value of the AC input voltage and a detected value detected by the AC input voltage sensor to diagnose a state of the AC input voltage sensor.

6. The charging system according to claim 1, wherein the controller is configured to repeatedly determine a state of the AC input voltage sensor at a predetermined period; and wherein, during one determination period, the controller is configured to calculate a heated amount due to the resistor using current passing through the resistor and the estimated resistance value of the resistor estimated during a previous period, subtract a predetermined heat dissipation amount from the calculated heated amount to derive temperature variation amount, and add the temperature variation amount to the estimated temperature of the resistor determined during the previous period to determine the estimated temperature of the resistor.

7. A method of diagnosing a sensor applied to the charging system which comprises an alternating current (AC) input voltage sensor configured to detect a voltage of an input end with AC power applied thereto; a resistor connected to the input end; a power factor correction circuit unit configured to adjust and output a power factor of AC power applied through the resistor; a capacitor to which an output voltage of the power factor correction circuit unit is applied; and a controller configured to diagnose the AC input voltage sensor based on a value of current passing through the resistor, a value of the voltage of the capacitor, and a resistance value of the resistor, comprising:
    receiving, by the controller, a detected value of current passing through the resistor and a detected value of a voltage of the capacitor when an alternating current (AC) input voltage is applied to the input end;
    estimating, by the controller, a resistance value of the resistor based on the temperature;
    estimating, by the controller, a value of the AC input voltage using the estimated resistance value of the resistor, the detected value of the current, and the detected value of the voltage;
    comparing, by the controller, a detected value of an AC input voltage detected by the AC input voltage sensor and the estimated value of the AC input voltage estimated in the estimating of the voltage; and
    diagnosing, by the controller, a state of the AC input voltage sensor based on a difference between the detected value of the AC input voltage and the estimated value of the AC input voltage.

8. The method according to claim 7, wherein the method is repeatedly performed at a predetermined period; and wherein the estimating of the resistance value includes determining, by the controller, the resistance value of the resistor based on an outdoor temperature during a first period.

9. The method according to claim 8, wherein the estimating of the resistance value includes:
    calculating, by the controller, a heated amount due to the resistor using current passing through the resistor and the estimated resistance value of the resistor estimated during a previous period;
    subtracting, by the controller, a predetermined heat dissipation amount from the calculated heated amount to derive temperature variation amount;
    adding, by the controller, the temperature variation amount to the estimated temperature of the resistor determined during the previous period to determine the estimated temperature of the resistor; and
    determining, by the controller, the resistance value of the resistor based on the estimated temperature of the resistor.

10. The method according to claim 7, wherein the receiving of the detected value includes opening, by the controller, a relay connected in parallel to opposite ends of the resistor to transmit AC power input through the input end through the resistor.

* * * * *